United States Patent [19]

Ebihara et al.

[11] 4,224,531
[45] Sep. 23, 1980

[54] DATA TRANSFER CIRCUIT

[75] Inventors: Heihachiro Ebihara; Fukuo Sekiya, both of Tokorozawa; Takashi Yamada, Sayama, all of Japan

[73] Assignee: Citizen Watch Co., Ltd., Tokyo, Japan

[21] Appl. No.: 883,867

[22] Filed: Mar. 6, 1978

[30] Foreign Application Priority Data

Mar. 11, 1977 [JP] Japan .................................. 52-26836

[51] Int. Cl.² ............................................. G11C 19/28
[52] U.S. Cl. .................................... 307/221 C; 328/37
[58] Field of Search ....................... 307/221 R, 221 C; 328/37

[56] References Cited

U.S. PATENT DOCUMENTS

| | | | |
|---|---|---|---|
| 3,621,283 | 11/1971 | Teer | 307/221 C |
| 3,986,046 | 10/1976 | Wunner | 307/221 C |
| 4,020,362 | 4/1977 | Suzuki et al. | 307/221 C |

*Primary Examiner*—John S. Heyman
*Attorney, Agent, or Firm*—Sherman & Shalloway

[57] ABSTRACT

A data transfer circuit consisting of a shift register circuit, which is efficiently applicable to portable electronic devices such as a portable electronic timepiece, electronic computer or the like is disclosed. The circuit comprises a first shift register circuit and a second shift register circuit to which is transferred data from said first shift register circuit. The second shift register circuit includes at least first stage bit whose data transfer is controlled by two phase clocks and another bit whose data transfer is controlled by one phase clock.

14 Claims, 11 Drawing Figures

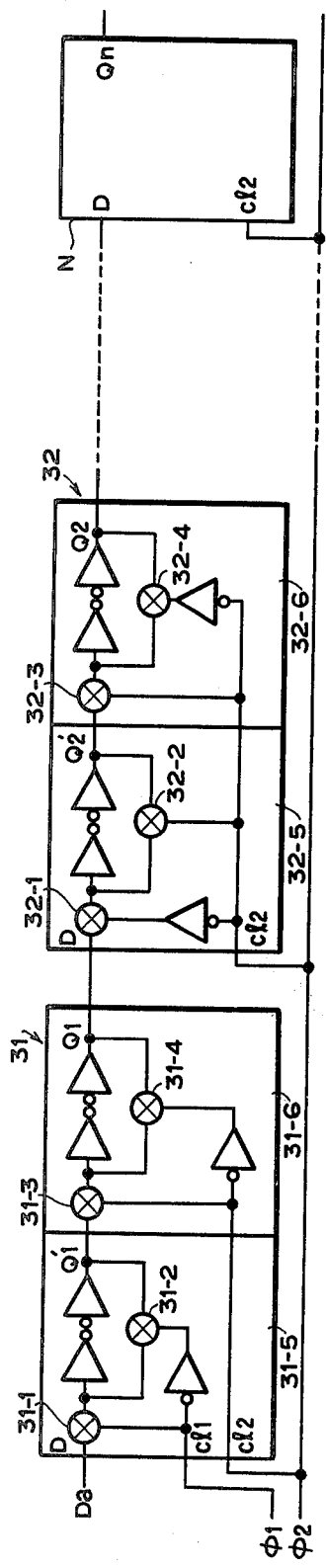 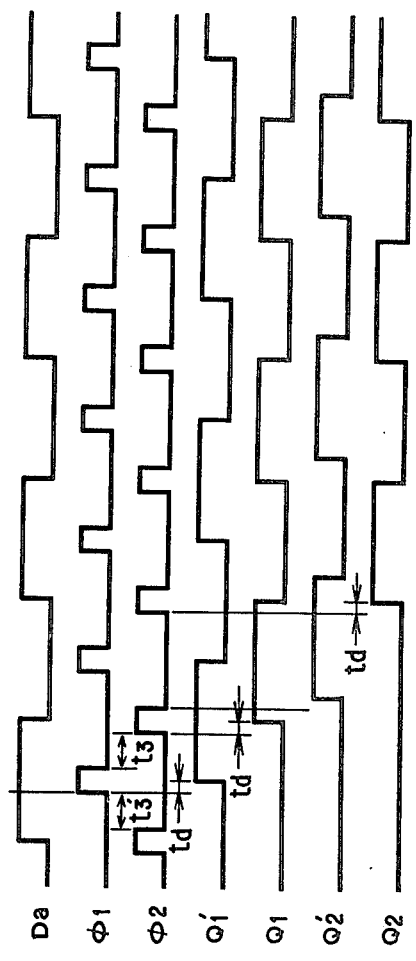
FIG. 3A
FIG. 3B

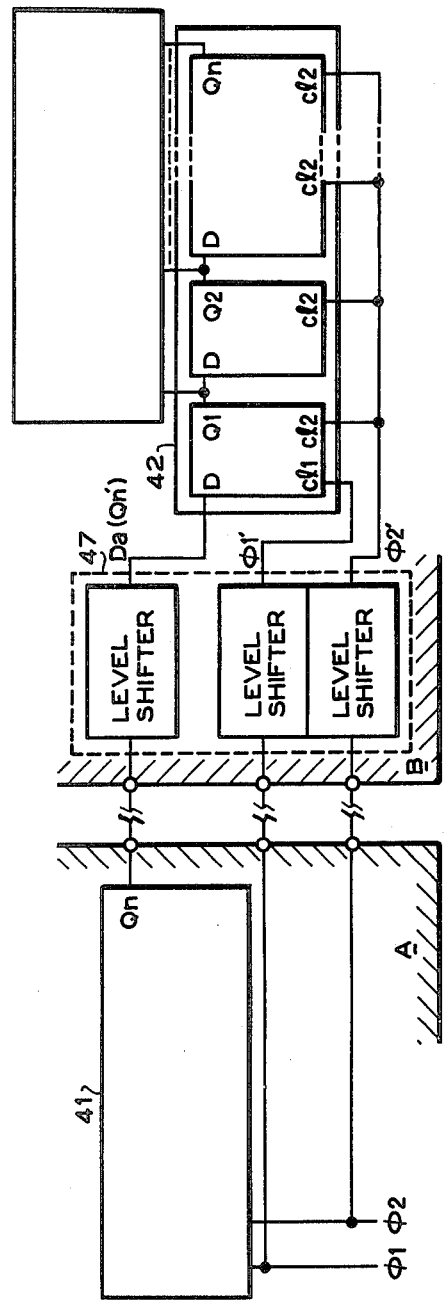
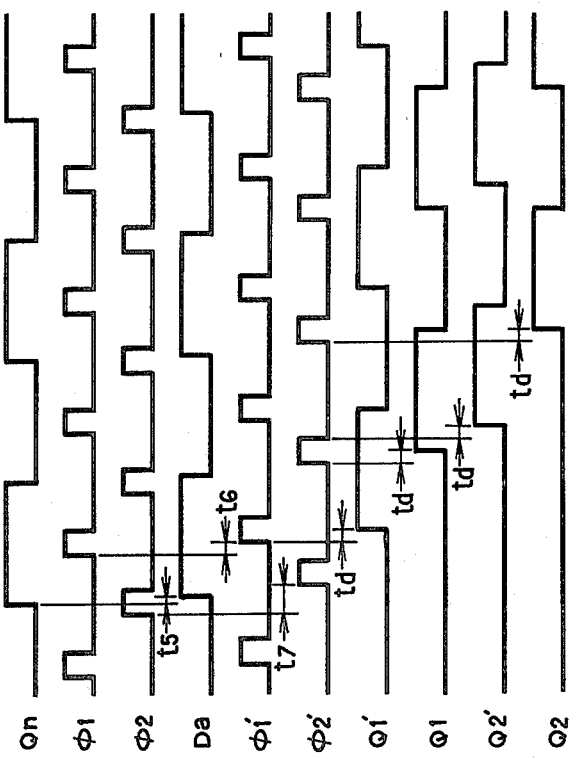
FIG. 4A
FIG. 5

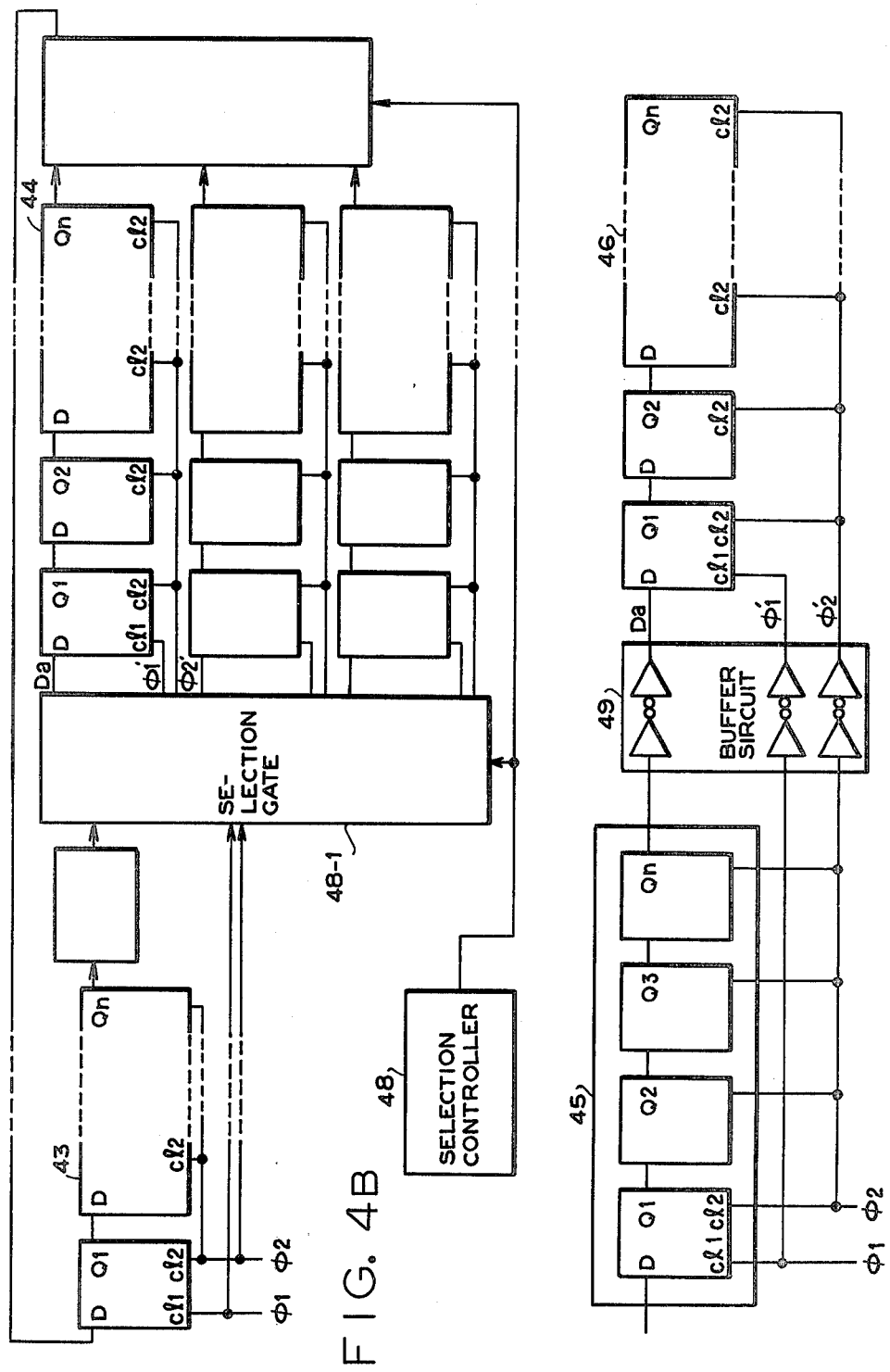

DATA TRANSFER CIRCUIT

BACKGROUND OF THE INVENTION

1. Field of the Invention

This invention relates to a data transfer circuit consisting of a shift register circuit.

2. Description of the Prior Art

Heretofore it has been the well known technique to provide a shift register for transferring data by means of a one phase data transfer clock $\phi$ (which will be abbreviated as a clock) as shown in FIG. 1A and provide a shift register for transferring data by means of two phase clocks $\phi_1$, $\phi_2$ as shown in FIG. 2A. These well known shift registers have advantage and disadvantage which contradict each other.

As seen from FIG. 1A, the shift register for transferring data by means of the one phase clock $\phi$ has the advantage that it is sufficient enough to provide a clock wiring for one phase portion only, but has the disadvantage that if the clock is delayed up to a position shown by dotted lined in a transfer timing diagram shown in FIG. 1B, it is impossible to transfer precise data. A delay time $t_1$ of the clock $\phi$ shown by dotted lines easily occurs when the data are transferred from a first shift register to a second shift register which is different in potential from the first shift register.

The shift register for transferring data by means of the two phase clocks $\phi_1$, $\phi_2$ as shown in FIG. 2A has the advantage that the use of the two phase clocks $\phi_1$, $\phi_2$ ensure a sufficiently long allowable delay time $t_2$, $t_2'$ for the clocks $\phi_1$, $\phi_2$, but has the disadvantage that it is necessary to provide a clock wiring for two phase portions.

SUMMARY OF THE INVENTION

An object of the invention, therefore, is to provide a data transfer circuit consisting of a shift register circuit, which has a sufficiently long allowable delay time for clocks and which can simplify a clock wiring and hence can be incorporated into an integrated circuit in a highly dense manner.

A feature of the invention is the provision of a data transfer circuit comprising a first shift register circuit and a second shift register circuit to which is transferred data from said first shift register circuit, said second shift register circuit including at least first stage bit whose data transfer is controlled by two phase clocks and another bits whose data transfer is controlled by one phase clock.

BRIEF DESCRIPTION OF THE DRAWINGS

FIG. 3A is a block circuit diagram of a shift register according to the invention;

FIG. 3B is a transfer timing diagram of the shift register according to the invention shown in FIG. 3A;

FIG. 4A is a block circuit diagram of one embodiment of a data transfer circuit consisting of a shift register circuit according to the invention;

FIG. 4B is a block circuit diagram of another embodiment of a data transfer circuit consisting of a shift register circuit according to the invention;

FIG. 4C is a block circuit diagram of a further embodiment of a data transfer circuit consisting of a shift register circuit according to the invention;

FIG. 5 is a transfer timing diagram of the shift register circuits according to the invention shown in FIGS. 4A, 4B and 4C.

DETAILED DESCRIPTION OF THE PREFERRED EMBODIMENTS

Figure 1A:
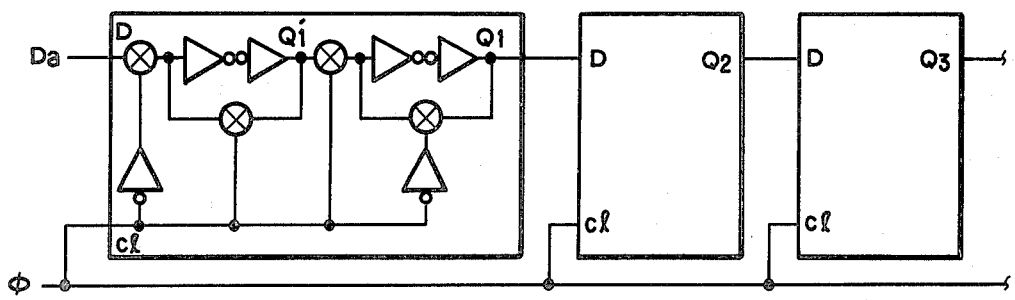
FIG. 1A is a block circuit diagram of a conventional shift register for transferring data by means of one phase clock $\phi$.
Figure 1B:
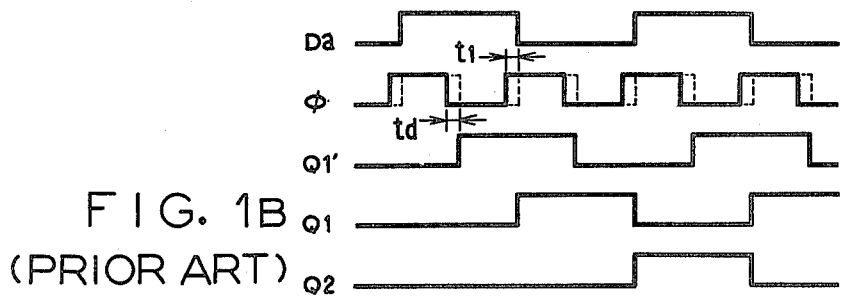
FIG. 1B is a transfer timing diagram of the shift register shown in FIG. 1A.
Figure 2A:
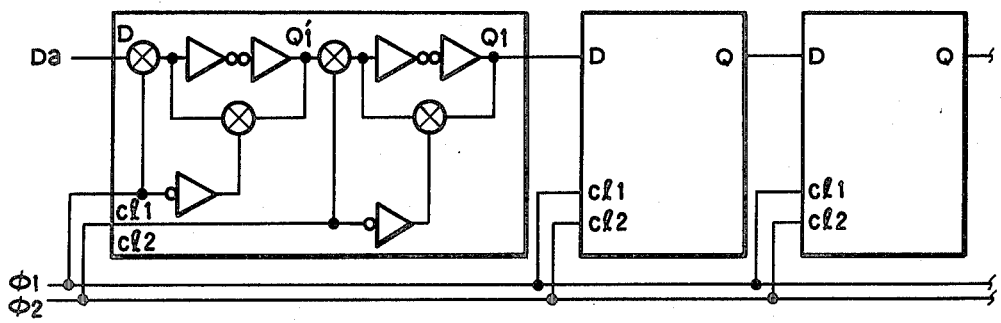
FIG. 2A is a block circuit diagram of a conventional shift register for transferring data by means of two phase clocks $\phi_1$, $\phi_2$.
Figure 2B:
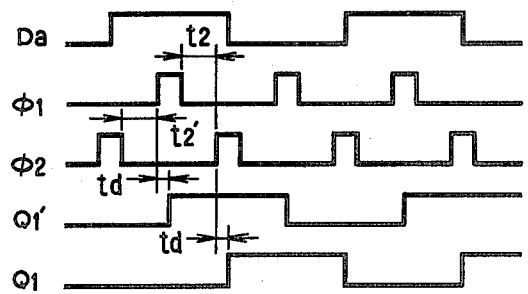
FIG. 2B is a transfer timing diagram of the shift register shown in FIG. 2A.

FIG. 3A is a block circuit diagram of a shift register circuit according to the invention. FIG. 3B is a transfer timing diagram of the shift register circuit shown in FIG. 3A. Referring to FIG. 3A, reference numeral 31 designates a first stage bit of the shift register and 32 a second stage bit thereof. The following stage bits inclusive of a third to N of the stage bit N are the same in construction as the second stage bit 32.

The first stage bit 31 comprises transmission gates 31-1, 31-2, 31-3 and 31-4 each provided with a control input terminal which upon receipt of an input "1" causes the transmission gate to make conductive. The second stage bit 32 comprises transmission gates 32-1, 32-2, 32-3 and 32-4 each provided with a control input terminal which upon receipt of an input "1" causes the transmission gate to make conductive.

The first stage bit 31 makes use of two phase clocks $\phi_1$, $\phi_2$. A master portion of the first stage bit 31 function to read in an input data Da when the clock $\phi_1$ is "1". The input data Da is passed through two inverter stages to provide a master portion output $Q_1'$. The output $Q_1'$ is latched by means of a feed back loop inclusive of the transmission gate 31-2 when the clock $\phi_1$ is "0". A slave portion 31-6 of the first stage bit 31 functions to read in the latched data $Q_1'$ of the master portion 31-5 when the clock $\phi_2$ is "1" and the data $Q_1'$ is passed through two inverter stages to provide a slave portion output $Q_1$. The output $Q_1$ is latched by means of a feed back loop inclusive of the transmission gate 31-4 when the clock $\phi_2$ is "0". The clock $\phi_2$ is a data transfer clock for the second bit and the following successive bits.

A master portion 32-5 of the second bit 32 functions to read in the latched data $Q_1$ of the slave portion of the first stage bit 31 when the clock $\phi_2$ is "0". The output $Q_1$ is passed through two inverter stages to provide a master portion output $Q_2'$. The output $Q_2'$ is latched by means of a feed back loop inclusive of the transmission gate 32-2 when the clock $\phi_2$ is "1". A slave portion 32-6 of the second bit 32 functions to read in the latched data $Q_2'$ of the master portion 32-5 when the clock $\phi_2$ is "1". The data $Q_2'$ is passed through two inverter stages to provide a slave portion output $Q_2$. The slave portion output $Q_2$ is latched by means of a feed back loop inclusive of the transmission gate 32-4 when the clock $\phi_2$ is "0". The following successive bits function in the same manner as the second bit 32 to transfer the data by means of the one phase clock $\phi_2$.

As shown in FIG. 3B, the first stage input data Da is so related to the clocks $\phi_1$, $\phi_2$ that the advantage of the two phase clock shift register that the allowable delay times $t_3$, $t_3'$ of the clocks $\phi_1$, $\phi_2$ become sufficiently long. In addition, in the second bit and the following successive bits, the clock $\phi_2$ is not delayed from the previous stage output data. Because, the previous stage output data passes through the inverters and the like after the clock $\phi_2$ has been changed and hence requires an element passing time td.

The shift register circuit described with reference to FIGS. 3A and 3B makes use of the two phase clock type first stage bit and hence can transfer precise data. In addition, the bits other than the first stage bit are composed of the one phase clock type shift registers and hence can be incorporated into an integrated circuit with a clock wiring area significantly reduced, thereby providing an integrated circuit with circuit elements incorporated therein in a highly dense manner.

FIG. 4A shows an embodiment of a data transfer circuit according to the invention for transferring data from a first shift register to a second shift register which is different in potential from the first shift register. The data transfer circuit according to the present embodiment is particularly effective when blocks A and B are incorporated into separate integrated circuit chips, respectively. In FIG. 4A, reference numeral 47 designates a level shifter.

FIG. 4B shows another embodiment of a data transfer circuit for selectively transferring data from a first shift register to a second shift register according to the invention. In FIG. 4B, reference numeral 48 designates a selective controller and 48-1 a selection gate.

FIG. 4C shows a further embodiment of a data transfer circuit for transferring data from a first shift register 45 to a second shift register 46 located at a relatively distant apart position. The present embodiment corresponds to the case in which the first and second shift registers 45, 46 are incorporated into separate integrated circuit chips, respectively. In FIG. 4C, reference numeral 49 designates a buffer circuit.

In the embodiments shown in FIGS. 4A, 4B and 4C, the level shifter 47, selection gate 48-1 and buffer circuit 49 are interposed between data output side shift registers 41, 43, 45 and data input side shift registers 42, 44, 46, respectively, and as a result, an input data Da and clocks $\phi_1'$, $\phi_2'$ of the data input side shift registers 42, 44, 46 become delayed from an output data QN and clocks $\phi_1$, $\phi_2$ of the data output side shift registers 41, 43, 45 by $t_5$, $t_6$, $t_7$, respectively, as shown in FIG. 5. Particularly, the clock $\phi_2'$ corresponds to the clock for the one phase clock shift register and hence the clock input terminals of all of the data input side shift registers constitute load. As a result, the delay time $t_7$ becomes significantly long and the clock $\phi_2'$ is delayed from the input data Da.

It is a matter of course that the one phase clock shift register exceeds the allowable delay time and that it is impossible to precisely transfer the data. The embodiments shown in FIGS. 4A, 4B and 4C make use of the shift register circuit according to the invention in which the first stage bit is composed of the two phase clock type shift register, and as a result, it is possible to read in that portion of the data which is stabilized.

In FIG. 5, $Q_1'$ is a master portion output of that first stage bit which has read in the input data Da by means of the clock $\phi_1'$. $Q_1$ is a slave portion output which has read in the master portion output $Q_1'$ by means of the clock $\phi_2'$ for driving the second bit and the following succeeding bits. $Q_2'$ is a master portion output of the second bit which has been read in when the clock $\phi_2'$ is "0". $Q_2$ is a slave portion output of the second bit which has been read in when the clock $\phi_2'$ is "1". In the similar manner, the precise data is transferred in the following succeeding bits.

Figure 6A:
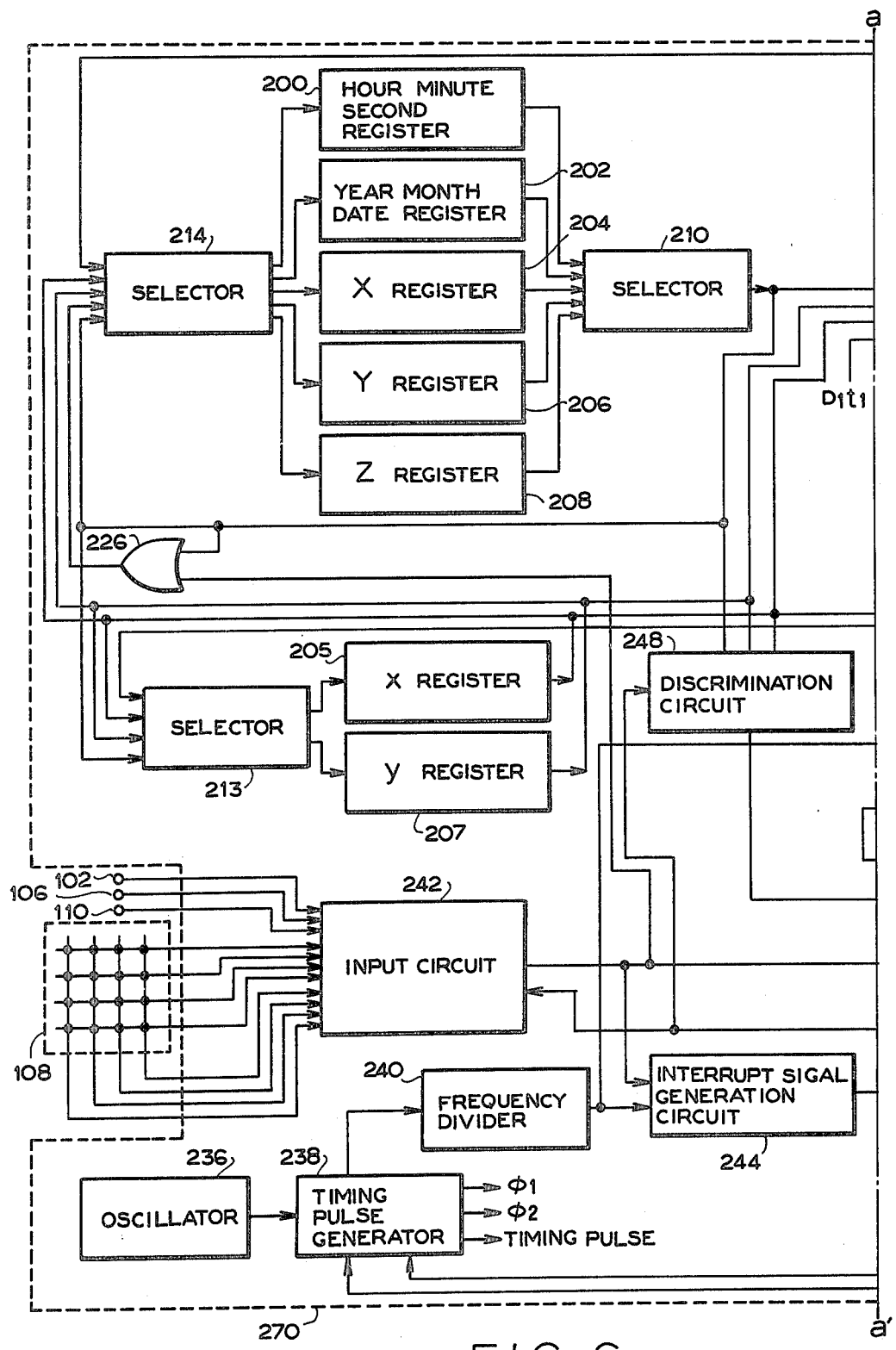
FIG. 6 is a block circuit diagram of an embodiment of a portable electronic device according to the invention.
Figure 6B:
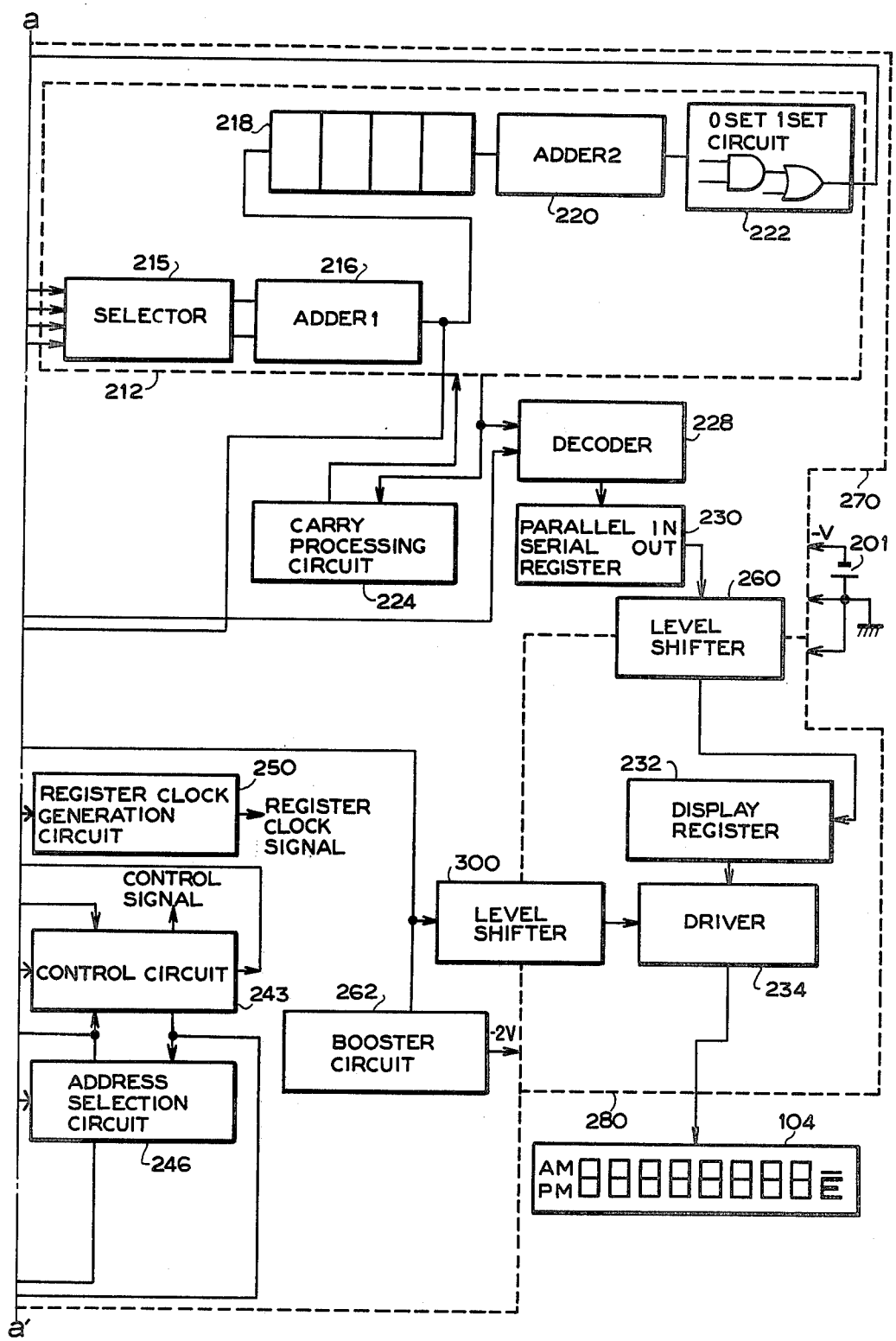

FIG. 6 shows a block circuit diagram of an embodiment of a portable electronic device according to the invention. In FIG. 6, a reference numeral 201 designates a battery operative as an electric source for supplying an electric power, 200 an hour minute second shift register which functions to memorize a time information of hour, minute and second and 202 a year month day shift register which functions to memorize a time information of year, month and day. The shift registers 200 and 202 each constitutes a time counting shift register. Reference numeral 204 designates an X register, 206 a Y regisrer and 208 a Z register. All of these registers 204, 206 and 208 constitute computing shift registers.

An x register 205 is a 4 bit shift register for memorizing a decimal point information held by the X register 204. A y register 207 is a 4 bit shift register for memorizing a decimal point information held by the Y register 206.

All of the shift registers 200, 202, 204, 206, 208, 205, 207 are static or semi-static shift registers which are capable of statically memorizing information even when the clock signal is not applied thereto. Numerical value data held by the shift registers 200, 202, 204, 206, 208 are selectively supplied by means of a selector 210 to an operational circuit 212 where operations required are effected and then returned through a selector 214 to the shift registers 200, 202, 204, 206, 208.

The decimal point data of the x register 205 and y register 207 are supplied to the operational circuit 212 and subjected to necessary operations with the aid of an adder 216 and then returned through a selector 213 to the x and y resisters 205, 207. The numerical value data outputs from the selector 210 are returned through the selector 214 to the registers or through register OR gate 226 and selector 214 to the registers or through the selector 213, either the x register 205 or y register 207 and selector 214 to the registers. The decimal point data of the x and y registers 205, 207 are eventually not supplied to the operational circuit 212, but returned through the selector 213 to the x and y registers 205, 207. Either one of the above mentioned various loops is selected by a control signal delivered from a control circuit 243 to be described later. Each of the above mentioned registers functions to transfer data by means of a register clock signal delivered from a register clock generation circuit 250 to be described later.

The operational circuit 212 is composed of a selector 215 for selecting an input, adder 216, 4 bit shift register 218, correction adder 220 and 0 set 1 set circuit 222. The contents of the shift register 218 is investigated by a carry processing circuit 224 so as to deliver a signal for instructing the carry processing to the operational circuit 212. The data of the 4 bit shift register 218 and the decimal point data of the x register 205 are supplied to a decoder 228 which functions to convert these data into a display segment signal. When the data of one digit portion are aligned in the 4 bit shift register 218, the output from the decoder 228 is supplied to a parallel 1 N serial OUT register 230 in a parallel 1 N manner. The display segment signal of the register 230 is supplied as a serial output to a display shift register 232. After the display segment signal of one digit portion has been supplied to the display register 232, the next display segment signal of one digit portion is supplied to the parallel of 1 N serial OUT shift register 230 in a parallel 1 N manner and then supplied as a serial output to the display shift register 232. The display shift register 232 is constituted by a shift register which is capable of statically memorizing informations. A driver 234 functions to drive a crystal display device 104 in dependent on the contents memorized in the display register 232.

In FIG. 6, reference numeral 262 designates a booster circuit which delivers an output of −2 V. A block 270 shown by dotted lines is driven by a voltage of −V delivered from the first electric source, i.e., the battery 201, while a block 28 shown by dotted lines is driven by an output voltage of −2 V delivered from the second electric source, i.e., the booster circuit 262. All of the signals transferred from the dotted lines block 270 to the dotted lines block 280 are converted from a signal having a potential between ground voltage and −V into a signal having a potential between ground voltage and −2 V.

In FIG. 6, reference numeral 236 designates an oscillator for generating a reference signal. As the oscillator 236, it is preferable to use a crystal oscillator in view of precision in time counting and consumed current. The system is so constructed that the operation can be completed by an oscillation frequency of 32.768 KHz within 1 second. The reference signal is supplied from the oscillator 236 to a timing pulse generator 238 which generates $\phi_1$, $\phi_2$ signals mainly consisting of the clock signals for respective registers and various kinds of timing signals. A frequency divider 240 functions to divide the frequency of the reference signal or the frequency thus divided of the reference signal so as to generate a time counting unit signal. The time counting unit signal is delivered to an interrupt signal generation circuit 244. In the present embodiment, as the time counting unit signal, use may be made of a 1 Hz signal. Operating signals delivered from exteriorly operable switches 102, 106, 110 and a key board 108 are interpreted by an input circuit 242 and then supplied to the control circuit 243 and interrupt signal generation circuit 244. The interrupt signal generation circuit 244 functions to generate an interrupt signal by means of the time counting unit signal sent from the frequency divider 240 and the operating signal sent from the input circuit 242 and set an address selection circuit 246 to an operational address. A discrimination circuit 248 functions to discriminate the contents of respective registers from each other and deliver the result thus discriminated to the control circuit 243. The control circuit 243 functions to generate various kinds of control signals from the address of the address selection circuit 246, the result discriminated of the discrimination circuit 248 and the operating signal of the exteriorly operable members of the input circuit 242. In addition, the control circuit 243 causes the address selection circuit 246 to advance to a given address. A register clock generation circuit 250 functions to generate a clock signal for each register from the control signal delivered from the control circuit 243 and the $\phi_1$, $\phi_2$ signals delivered from the timing pulse generator 238, if necessary. The output instruction of the clock signal delivered from the control circuit 243 to the register clock generation circuit 250 is delivered when the address of the address selection circuit 246 is located at the operational address or the display transfer address, that is, when the address of the address selection circuit 246 is not under its initial condition. As a result, each register functions to operate only when the data transfer for the operation or the display is effected and normally functions to statically memorize the data. In this way, the shift register does not normally consume the dynamic current.

The address signal of the address selection circuit 246 is also supplied to the input circuit 242. This address signal causes the input circuit 242 to prohibit its reading in the operating signal delivered from the exteriorly operable member when the address of the address selection circuit 246 is located at the operational or display address, that is, the address is not under its initial condition. The timing pulse generator 238 ceases from delivering the timing pulse when the address of the address selection circuit 246 is returned to its initial condition. As a result, the timing pulse generator 238 does not normally consume the electric power.

If 1 Hz of the output from the frequency divider 240, that is, the time counting unit signal raises up, the interrupt signal generation circuit 244 functions to generate the interrupt signal to cause the address selection circuit 246 to set to the time counting operational address. If the address is set to the time counting operational address, the control circuit 243 functions to deliver a control signal so as to close a loop for returning the data of the hour minute second register 200 through the selector 210, operational circuit 212 and selector 214 to the hour minute second register 200 during the first 1 word cycle. At the same time, the register clock generation circuit 250 functions to deliver the clock signal for the hour minute second register 200 and the 4 bit shift register 218 so as to cause the data of the hour minute second register 200 to make a round of the above mentioned loop. In this case, the selector 215 functions to select the output from the selector 210 so as to deliver the output thus selected and a $\boxplus_1 t_1$ signal to the adder 216. The $\boxplus_1 t_1$ signal is a signal which becomes "1" when LSB of 1 second digit of the hour minute second register 200 passes through the adder 216. As a result, the time information held by the hour minute second register 200 is replaced by that time information which is made 1 second forward. At the next 1 word cycle, the control circuit 243 functions to deliver such a control signal that a loop for returning the data of the year month date register 202 through the selector 210, operational circuit 212 and selector 214 to the year month date register 202. At the same time, the register clock generation circuit 250 functions to deliver the clock signal for the year month date register 202 and the 4 bit shift register 218 so as to cause the data of the year month date register 202 to make a round of the above mentioned loop. In this case, if the hour minute second regiser 200 has generated a carry signal at the previous 1 word cycle, "1" is added to LSB of the year month date register 202. At this 2 word cycle, the timing counting operation address is terminated. In the computing mode, when the time counting operation ends, the address selection circuit 246 is returned to its initial condition. That is, in the computing mode, the time counting operation only is effected, but the time is not displayed.

In the time counting mode, when the time counting operation address is terminated, the display transfer address is initiated. In the display address of the hour minute second mode in the time counting mode, the control circuit 243 functions to deliver such a control signal that a loop for returning the data of the hour minute second register 200 through the selector 210, operational circuit 212 and selector 214 to the hour minute second register 200. At the same time, the register clock generation circuit 250 functions to deliver the clock signal for the hour minute second register 200, 4 bit shift register 218, parallel 1 N serial OUT shift register 230 and display register 232. In this cycle, the time information of the hour minute second register 200 is converted into the display segment signal which is memorized in the display register 232. The display device 104 functions to display the hour minute second in accordance with the information of the display register 232. Similarly, in the display transfer address of the year month date mode of the time counting mode, the time information of the year month date register 202 is converted into the display segment signal which is then memorized in the display register 232 and the display device 104 functions to display the year month date. When the display transfer address is terminated, the address selection circuit 246 is returned to its initial condition to stop the timing pulse generator 238.

As long as the address selection circuit 246 remains in its initial condition, only the oscillator 236, frequency divider 240 and driver 234 operate. When the address selection circuit 246 is out of its initial condition, even though the exteriorly operable member is operated, the input circuit 242 does not function to read in the operating signal, but functions to read in such operating signal after the address selection circuit 246 has been returned to its initial condition.

In the computing mode, if the key board 108 is operated and the input circuit 242 functions to read in the operating signal, the signal delivered from the input circuit 242 causes the interrupt signal generation circuit 244 to generate the interrupt signal so as to set the address selection circuit 246 to the computing operational address.

In the computing operational address, the control circuit 243 functions to deliver such a control signal that a loop required for the X register 204, Y register 206, Z register 208, x register 205 and y register 207 is closed in accordance with that operational processing which is indicated by the address of the address selection circuit 246. When the operation is terminated, the address of the address selection circuit 246 is shifted to the display transfer address. The operation result is memorized in the X register 204.

In the display transfer address of the computing mode, the control circuit 243 and the register clock generation circuit 250 function to deliver such a signal that the numerical value data of the X register 204 is converted into the display segment signal which is then transferred to the display register 232.

When the address selection circuit 246 takes the operational address or the display transfer address, if the time counting unit signal causes the interrupt signal to generate, an interrupt await flip-flop provided in the address selection circuit 246 is set. This flip-flop functions to await until the address is returned to its initial condition. When the address is returned to its initial condition, the flip-flop causes the address to set to the time counting operational address and the flip-flop per se is reset.

The system according to the present embodiment is capable of processing the longest operation within a time shorter than 1 second, so that there is no risk of the time counting error being involved.

It is preferable to incorporate the circuit shown in FIG. 6 into at least two integrated circuit chips owing to the number of circuit elements. In this case, it is preferable to incorporate the shift registers 200, 202, 204, 206, 208 into an integrated circuit chip which is separated from that integrated circuit chip into which is incorporated the display register 232.

As stated hereinbefore, the shift register circuit according to the invention is capable of allowing a sufficiently long delay for clocks as in the case of a two phase clock type shift register and hence is capable of transferring precise data. In addition, bits other than the two phase clock type bit are composed of one phase clock type shift registers, so that clock wiring can be significantly reduced. As a result, the invention can efficiently be applied to portable electronic devices such as a portable electronic timepiece, electronic computer or the like which require a precise data transfer and an integrated circuit which is small in size and into which a number of circuit element are densely incorporated.

What is claimed is:

1. A data transfer circuit comprising:
    a timing pulse generator for generating first and second phase displaced clock signals;
    a data signal source for sending out a data signal in response to the second clock signal;
    a shift register circuit comprising a plurality of stage bits connected in cascade to each other, each stage bit including a master portion and a slave portion each having a clock input, a data input and a data output, the data output of the master portion being connected to the data input of the slave portion wherein the data input of the master portion and the data output of the slave portion form a data input and a data output of each stage bit, respectively;
    the data input of the first stage being coupled to the output of the data signal source;
    only the master portion of at least the first stage bit being controlled to transfer the data signal in response to the first clock signal and the slave portion of at least the first stage bit being controlled to transfer the data signal in response to the second clock signal; and
    the master and slave portion of the remaining stage bits being controlled to transfer the data signal in response to the second clock signal.

2. A data transfer circuit for transferring a data signal comprising:
    a timing pulse generator for generating first and second phase displaced clock signals;
    a first shift register circuit having a clock input receiving the second clock signal, a data input and a data output, wherein the data signal is supplied to the data input and is transferred to the data output in response to the second clock signal;
    a second shift register circuit comprising a plurality of stage bits connected in cascade to each other, each stage bit including a master portion and a slave portion each having a clock input, a data input and a data output, the data output of the master portion being connected to the data input of the slave portion wherein the data input of the master portion and the data output of the slave portion form a data input and a data output of each said stage bit, respectively;
    the data input of the first stage bit being coupled to the output of the first shift register; and
    only the clock input of the master portion of at least the first stage bit being supplied with the first clock signal and the clock input of the slave portion of at least the first stage bit being supplied with the second clock signal and the clock inputs of the master and slave portions of the remaining stage bits being supplied with the second clock signal, whereby each of the master and slave portions transfer the data at the input to the output in response to the clock signals supplied thereto.

3. The data transfer circuit according to claim 2 wherein the timing pulse generator comprises a source of a reference signal and means for generating first and second clock signals which alternatively have a first potential and a second potential with a timing in which the first and second clock signals simultaneously have the second potential before and after the second clock signal has the first potential.

4. A data transfer circuit according to claim 2 wherein data of said first shift register circuit is transferred through a level shift circuit to said second shift register circuit.

5. A data transfer circuit according to claim 2 wherein data of said first shift register circuit is transferred through a data selector to said second shift register circuit.

6. A data transfer circuit according to claim 2 wherein data of said first shift register circuit is transferred through a plurality of gate circuits to said second shift register circuit.

7. A data transfer circuit according to claim 2 wherein said first shift register circuit and said second shift register circuit are incorporated into an integrated circuit.

8. A data transfer circuit according to claim 7 wherein said first shift register circuit and said second shift register circuit are incorporated into integrated circuit chips which are different from each other, respectively.

9. A data transfer circuit according to claim 2 wherein said first shift register circuit and said second shift register circuit consist of the same shift resister.

10. A data transfer circuit according to claim 2 wherein said first shift register circuit is composed of a register for keeping time counting data.

11. A data transfer circuit according to claim 2 wherein said first shift register circuit is composed of a register for keeping calculation data.

12. A data transfer circuit according to claim 2 wherein said second shift register circuit is composed of a register for keeping display data.

13. A data transfer circuit according to claim 12 wherein said first shift register circuit is composed of a register for keeping time counting data.

14. A data transfer circuit according to claim 12 wherein said first shift register circuit is composed of a register for keeping calculation data.

* * * * *